US007403625B1

(12) United States Patent
Pedersen et al.

(10) Patent No.: US 7,403,625 B1
(45) Date of Patent: Jul. 22, 2008

(54) SIGNAL PROCESSING UNIT

(75) Inventors: Kim Rishoj Pedersen, Egå (DK); Knud Bank Christensen, Ryomgård (DK); Morten Lave, Højbjerg (DK)

(73) Assignee: TC Electronic A/S (DK)

( * ) Notice: Subject to any disclaimer, the term of this patent is extended or adjusted under 35 U.S.C. 154(b) by 805 days.

(21) Appl. No.: 10/049,415

(22) PCT Filed: Aug. 9, 2000

(86) PCT No.: PCT/DK00/00442

§ 371 (c)(1),
(2), (4) Date: Jul. 22, 2002

(87) PCT Pub. No.: WO01/11601

PCT Pub. Date: Feb. 15, 2001

(30) Foreign Application Priority Data

Aug. 9, 1999 (EP) .................................. 99202585

(51) Int. Cl.
*H03G 3/00* (2006.01)
*G10H 1/02* (2006.01)

(52) U.S. Cl. .......................................... 381/63; 84/630

(58) Field of Classification Search .................. 381/63, 381/61, 92; 84/630, 707
See application file for complete search history.

(56) References Cited

U.S. PATENT DOCUMENTS 4,731,848 A * 3/1988 Kendall et al. ................ 381/63
5,555,306 A * 9/1996 Gerzon ........................ 381/63
5,585,587 A 12/1996 Inoue et al.
5,862,233 A * 1/1999 Poletti ........................ 381/63

FOREIGN PATENT DOCUMENTS

EP 0 563 929 10/1993
WO WO 86 02791 5/1986

* cited by examiner

*Primary Examiner*—Xu Mei
(74) *Attorney, Agent, or Firm*—Cantor Colburn LLP

(57) ABSTRACT

The invention relates to a signal processing unit including an input for receiving an audio signal, and an early pattern generator connected to the input, for defining a predefined early pattern generation. The early pattern generator establishes an output having N directional components which are added to form a signal having N directional components. When representing each source output in a direction containing representation both directionality of the individual sound sources as well as the resulting directionality of the excited sound propagation may be contained and processed in a simple processing algorithm.

4 Claims, 4 Drawing Sheets

SIGNAL PROCESSING UNIT

CROSS REFERENCE TO RELATED APPLICATIONS

This application is related to the commonly assigned application entitled "Multi Channel Processing Method", filed concurrently herewith, which is incorporated herein by reference in its entirety.

FIELD OF THE INVENTION

The invention relates to a system for processing audio signals, and more particularly, to a system for providing a room simulation for processing audio signals in multiple channels.

BACKGROUND OF THE INVENTION

A reverberation imparting device is generally understood as a sound processing unit processing input signals representing an acoustic sound in such a way that the processed input signals are modified into an artificially established signal having desired acoustic properties as if the input signals were present in a certain room such as concert halls or the like.

Due to the relatively substantial requirements to the necessary hardware, the above-described technical discipline has been developed only recently.

The greatly improved facilities and possibilities of the commercially available digital signal processing processors and the correspondingly improved supporting A/D and D/A converting hardware have nevertheless provided a significant push-forward, as relatively large data streams may be processed, thus still improving the possibility of emulating the physical reality to a higher degree.

Nevertheless, it is still a fact that a true emulation of even a simple room may be quite complicated, both when considering the establishing of the theoretically necessary basics and the necessary supporting hardware.

A problem with the conventional technique, especially at the recording stage, is that naturalness is harder to obtain when the emulated sound image consists of several sound sources located in a simulated room.

Typically, sound rendering of multiple sound sources are generated by room simulators having one or two inputs and the processed input sound from the different sound sources basically shares the same early reflection pattern.

Consequently, the different sound sources are piled on top of each other in the resulting created sound image. The quality of this sound piling is far from convincing and simple individual panning of each source will suffer from equal sound impression due to the shared early reflection pattern.

An additional problem will arise with multi-channel recordings as each source should be handled very carefully in order to achieve naturalness.

It is one object of the invention to provide a room simulation for multi-channel sound processing.

SUMMARY OF THE INVENTION

The signal processing unit comprising at least one input (S), at least one of the said inputs (S) being connected to at least one early patterns generator (M), at least one early pattern generator (M) defining a predefined early pattern generation each of the said early pattern generator (M) establishing an output (d1, d2, d3, d4, . . . , dN) having N directional components, each of said directional components (N) of said outputs being added to form at least one signal having N directional components, an advantageous signal processing unit has been obtained as the result of each source may be added in a relatively simple operation to form a true representation of a real sound field being established in a real room.

When representing each source output in a direction containing representation both directionality of the individual sound sources and the resulting directionality of the excited sound propagation may be contained and processed in a simple processing algorithm.

Moreover, the directional representation may be established according to psycho-acoustic knowledge about human hearing. Thus, a directional representation having most directional components concentrated at directions of which the human ear may acknowledge real differences.

According to the invention, as directional summing has proven to accumulate both the true $0^{th}$ order directional sound signal (i.e. the direct sound signal) as well as the more complex directional reverberation signal.

A further aspect of an embodiment of the invention is that the initial sound signal processing may be established more or less separately from the establishing of the tail-sound signal. Accordingly, the direct sound and the low order reflections may be established by carefully tuning all implied early pattern generators, mixing the different sound signal into one initial sound signal representing all source signals, and adding the sound tail to the signal after the rendering of the P-channel signal.

The unit further comprises a direction rendering unit (201) having an input for signals having N directional components, the said direction rendering unit (201) establishing a P channel output signals on an output of the rendering unit (201) corresponding to input signals having N directional components, a further advantageous embodiment of the invention has been obtained.

Accordingly, a modular rendering of a P-channel sound image as a separate rendering stage provides a uniform rendering of all the input sources.

A further aspect of the above embodiment of the invention is that the early pattern module and the P-channel rendering stage may be adjusted and tuned individually.

A typical number of channels, i.e. the value of P, may vary from a stereo application having two channels or e.g. five channels up to e.g. twenty channels. Of course, the upper limit may be higher if appropriate.

The P channel output signals are established in such a way that they correspond to a P-channel trans or bin-aural representation of the N-directional input signal, an advantageous embodiment of the invention has been obtained.

The P channel output signals are established in such a way that they correspond to an experience-based P-channel representation of the N-directional input signal, a further advantageous embodiment of the invention has been obtained.

Other rendering methods within the scope of the invention may be P-channel vector-based amplitude panning of the N-directional input or P-channel based intensity panning of the N-directional input or combinations of the above mentioned methods.

The signal processing unit further comprises a circuit (202, 203) having S inputs and P outputs, the said S inputs being individual input channels for S input sources, the P channel outputs comprising a P-channel late reverberation signal, the signal processing unit further comprising a summing unit (204), the summing unit (204) adding the late reverberation signal to the established P-channel output signals of the direction rendering unit (201), a further advantageous embodiment of the invention has been obtained.

Hence, the reverberation signals may be added subsequently to the rendering of the established sum signal without disturbing the sound image to the listener due to the fact that the reverberation sound tail is more or less diffuse and consequently not very directional.

The modular adding of the sound tail to the established P-channel signal provides a further possibility of separate tuning of the modules in a very advantageous way as the establishing of a sound tail signal may be tuned more or less independently of the tuning of the S source early pattern generation stage and the rendering stage.

It should be noted, that the above reverberation stage should be tuned to fit to the specific chosen number of channels P.

The rendering unit comprises an input for N directional signals, the direction rendering unit (201) establishing a P channel output signal on an output of the rendering unit (201) corresponding to input signals having N directional components, a further advantageous embodiment of the invention has been obtained.

Accordingly, a rendering may be established independently of the location and number of all the input sources, as the rendering stage input is only one signal having N-directions.

A possible embodiment of the invention implies a five channel rendering of 10-directional signal where the directions of the input signal format are 0, +/−15, +/−30, +/−70, +/−110 and 180 degrees and the intended location of the five channels are 0, +/−30 and +/−110 degrees.

Obviously, several other directions and locations are applicable. A preferred embodiment comprises more than 20 directions.

Again, it should be noted that rendering of the sound signal may be established independently of how the input signal is generated.

The P channel output signals are established in such a way that they correspond to a P-channel trans-aural representation of the N-directional input signal, a further advantageous embodiment of the invention has been obtained.

The P channel output signals are established in such a way that they correspond to an experience-based P-channel representation of the N-directional input signal, a further advantageous embodiment of the invention has been obtained.

The early pattern generation mixer (29) comprises M inputs, each input receiving early pattern signals comprising N directional components, the mixer (29) further comprising at least one output, the at least one output transmitting an N-directional early patterns signal, the N-directional early patterns signal being established by adding the M inputs, a further advantageous embodiment of the invention has been obtained as a mix of the very complex directional signal may be established by simple summing.

The signal processing unit comprises at least one input (S), at least one of the inputs (S) being connected to at least one space processor, at least one space processor defining at least a generation of an early pattern each of said space processors establishing an output (d1, d2, d3, d4, . . . , dN) having N directional components, each of the directional components (N) of the outputs being added to form at least one signal having N directional components, a further advantageous embodiment of the invention has been obtained.

The method of representing an audio-signal, wherein said signal is decomposed to a signal comprising N directional components, an advantageous signal representation has been obtained as a directional representation, facilitates the possibility of a true and relatively simple processing of even very complicated audio signal scenarios.

Moreover, the approach of representing on audio signal as N directional components provides the possibility of treating both $0^{th}$ order signal, i.e. the direct sound, as well as more complicated reflection signals (i.e. $1^{st}$ and higher order reflections) in the same way and consequently under the same simulating conditions. Thus, the signal representation, according to the invention, provides a possibility of creating true correspondence between the direct sound and the resulting reflections in the sense that a signal may conveniently be represented as having both the direct sound and the reflections.

Moreover, the directional quantified representation provides a very distinct and accurate way of establishing a desired signal in a certain direction. It should be noted that traditional directional emulation is more or less based on individual panning of the different sound sources. According to the representation invention, the only uncertainty with respect to the directionality of the established sound signals refers to the method by which the directional representation is mapped (i.e. rendered) to a given number of channels. Nevertheless, it should be emphasised that the mutual directional spacing between sound signals is maintained as the rendering method is the same for all signals as has already been mentioned above. Consequently, the relative directional positioning is established by the signal format and not by sound engineers bound by traditional panning.

Thus, if distinct representations are desired, a high number of quantised directional components may be chosen.

Preferably, the N-directional components should of course represent a given signal at a specific geometrical position.

The signal is decomposed to a signal comprises N directional components by means of dedicated signal-processing means, an advantageous embodiment of the invention has been obtained as the signals may be established in real-time.

The method of processing audio signals comprises M sub-signals, each sub-signal being represented as a signal having N directional components (d1, d2, d3, d4, . . . ), the sub-signals being added to form a sum-signal having N directional components (Σd1, Σd2, Σd3, Σd4, . . . , ΣdN), where Σdi(i=1 . . . N) is the sum of signal components is one of the N directions, the sum-signal representing the resulting audio signal, a further advantageous embodiment of the invention has been obtained as even very complicated audio-signals may be added by means of conventional summing means to form a complex and true signal which may establish several sound source positions in one signal.

The signal processing unit comprises at least one input (S), at least one of the inputs (S) being connected to at least one reverberation unit at least one reverberation unit defining a predefined reverberation generation each of the reverberation units establishing an output (d1, d2, d3, d4, . . . ) having N directional components, each of said directional components (N) of said outputs being added to form at least one signal having N directional components, a further advantageous embodiment of the invention has been obtained as the signal-representation and signal-processing algorithm may basically be processed on both initial sound signals and the sound tail signal as well according to the invention.

DETAILED DESCRIPTION OF THE DRAWINGS

The invention will be described below with reference to the drawings of which

DETAILED DESCRIPTION OF PREFERRED EMBODIMENTS

According to most embodiments of the invention, it is the general approach that artificial generation of room simulated sound should comprise an early reflection pattern and a late sound sequences, i.e. a tail sound signal.

It should be noted that the invention is basically directed at the early reflection patterns, and consequently sound processing based on early reflections patterns within the scope of the invention.

Figure 1:
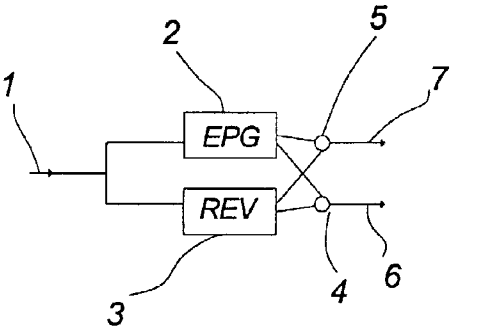
FIG. 1 shows the basic understanding of a reverberated sound

FIG. 1 illustrates the basic principles of a conventional signal processing unit.

The circuit comprises an input 1 communicating with an initial pattern generator 2 and a subsequent reverberation generator 3. In addition, the initial pattern generator 2 and the subsequent reverberation generator 3 are connected to two mixers 4, 5 having output channels 6 and 7, respectively.

The initial pattern generator 2 generates an initial sound sequence with relatively few signal reflections characterising the first part of the desired emulated sound. It is a basic assumption that the initial pattern is very important as a listener establishes a subjective understanding of the simulated room on the basis of even a short initial pattern.

An explanation of this performance is that the signal reception corresponds to the actual sound propagation and reflection in a real life room.

Hence, reflections in a certain room will initially comprise relatively few reflections, as the first sound reflection, also called first order reflections, have to propagate from a sound source at a given position in the room to the listener's position via the nearest reflecting walls or surfaces. Compared with the overall heavy complexity of the technique, this sound field will be relatively simple and may therefore be emulated in dependency of the room and the position of the source and the listener.

Subsequently, and of course with some degree of overlapping, the next reflections will appear at the listeners position. These reflections, also called second order reflections, will be the sound waves transmitted to the position of the receiver via two reflecting surfaces.

Gradually, this sound propagation will increase in dependency of the room type, and finally the last reflected sound will be of a more diffuse nature as it comprises several reflections of several different orders at different times.

Apparently, the sound propagation will gradually result in a diffuse sound field and the sound field will more or less become a "sound soup". This diffuse sound field will be referred to as the tail sound.

If the walls have high absorption coefficients, the propagation will decrease quite fast after a short time period of time while the sound propagation will continue over a relatively long period of time if the absorption coefficients are low.

Figure 2:
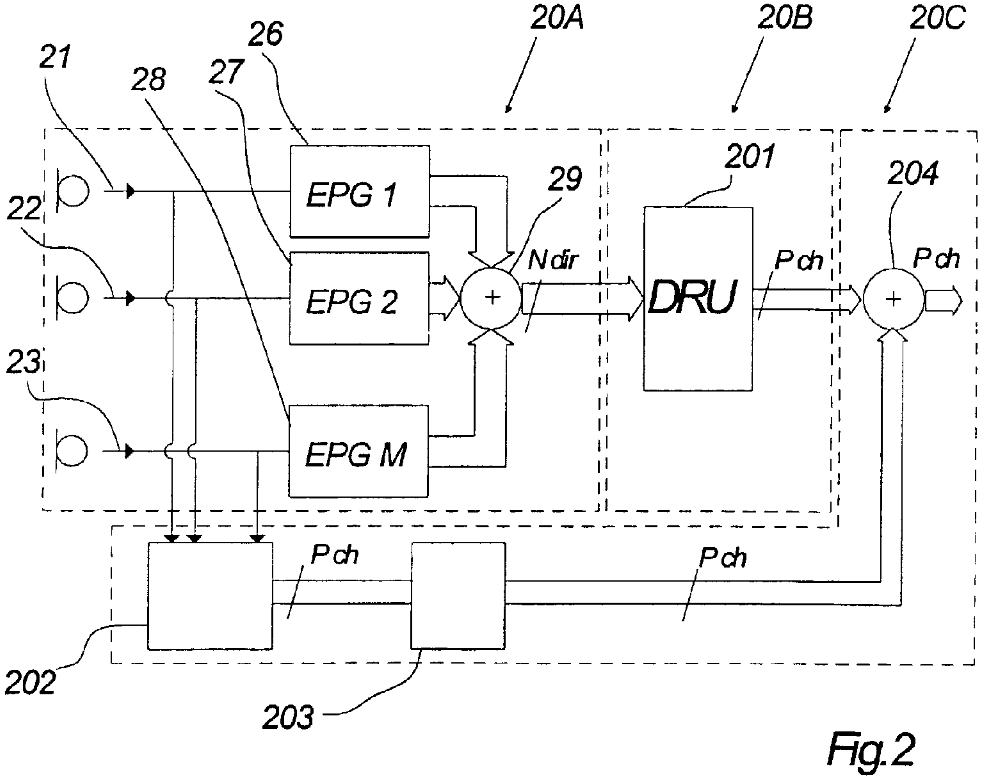
FIG. 2 shows the basic principles of a sound processing device according to the invention

FIG. 2 illustrates the basic principles of a preferred embodiment of the invention.

For reasons of explaining, the shown embodiment of the invention has been divided into three modules 20A, 20B and 20C.

The first module 20A of the room simulator, according the embodiment shown, comprises M source inputs 21, 22, 23.

The source inputs 21, 22 and 23 are each connected to an early pattern generator 26, 27 and 28.

Each early pattern generator 26, 27 and 28 outputs M directional signals to a summing unit 29. The summing unit adds the signal components of each of the N predetermined directions from each of the early pattern generators 26, 27 and 27.

The summing unit output N directional signals to the module 20B comprising direction rendering unit 201.

Figure 3A:
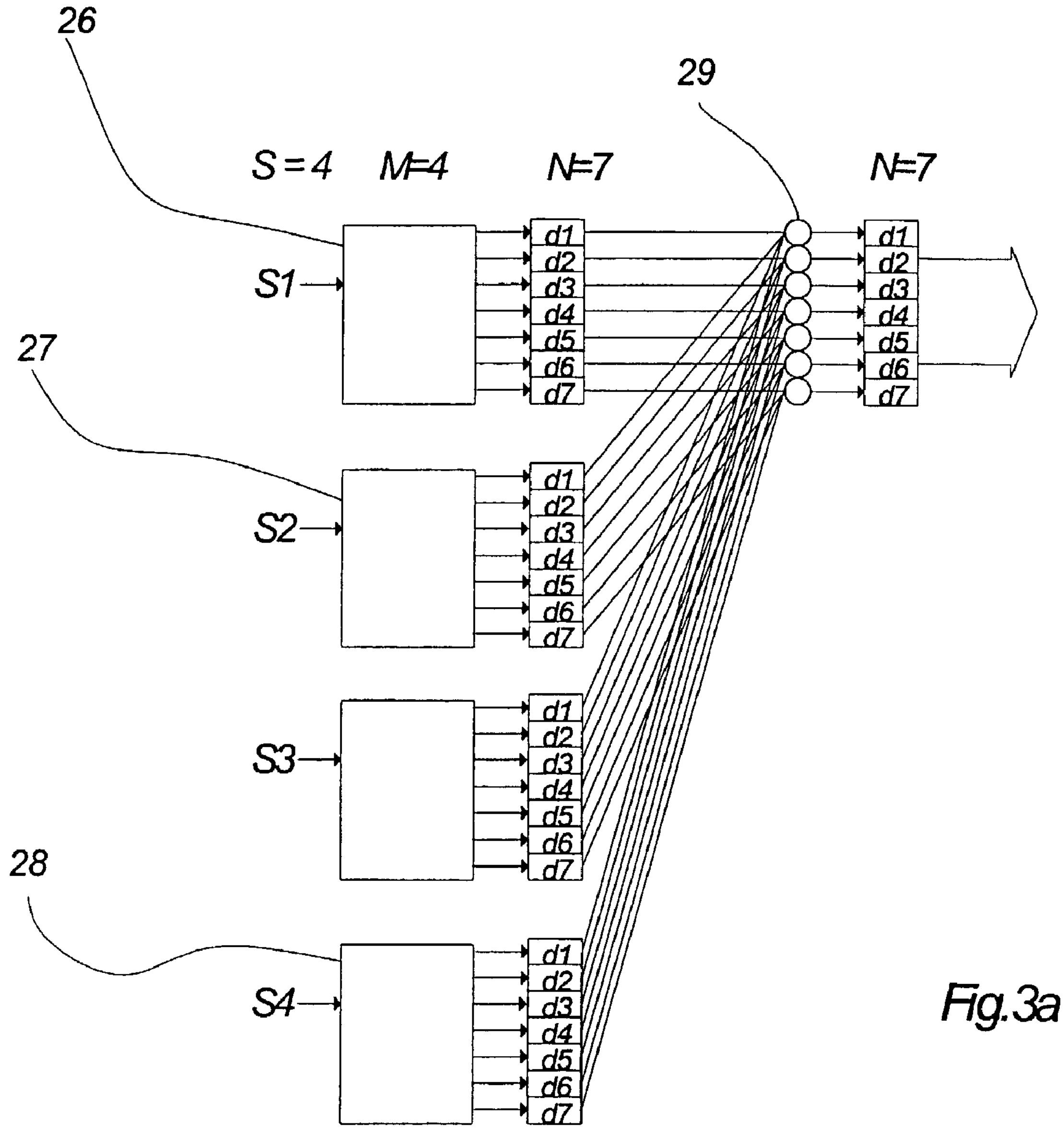
FIGS. 3*a*-3*c* shows different sub-portions of the system according to the invention and FIGS. 4*a*-4*b* illustrates early pattern generators according to the invention

The basic establishing of the N directional signals has been illustrated in FIG. 3*a*.

Now returning to FIG. 2, the direction rendering unit converts the N directional signal to a P channel signal representation.

Figure 3B:
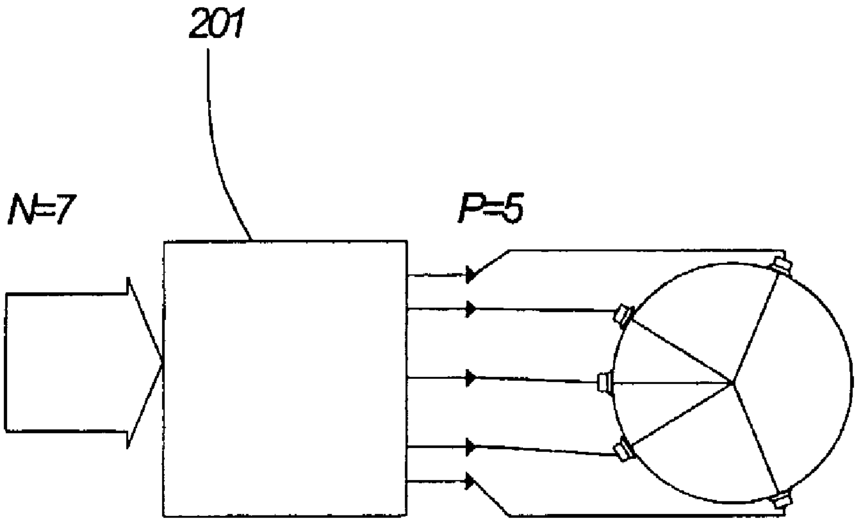

The basic establishing of the P channels of module 20B has been illustrated in FIG. 3*b*.

Moreover, the system comprises a third module 20C. The module 20C comprises a reverb feed matrix 202 fed by the M source inputs 21, 22, 23. The reverb feed matrix 202 outputs P channel signals to a reverberator 203 which, in turn, outputs a P channel signal to a summing unit 204.

Thus, the summing unit 204 adds the P channel output of the reverberator 203 to the output of the direction rendering unit 201 and feeds the P channel signal to an output.

Figure 3C:
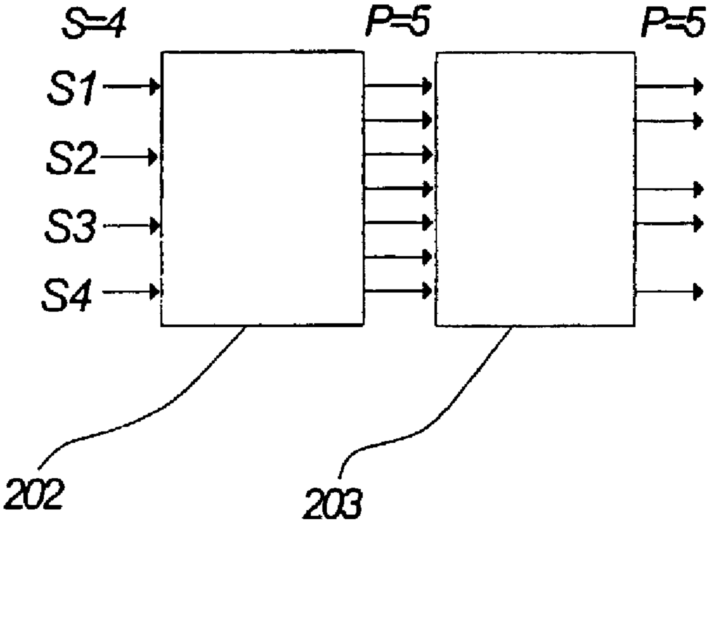

The basic establishing of the P channels of module 20C has been illustrated in FIG. 3*c*.

Before explaining the overall functioning of the algorithm, the basic functioning of the early pattern generators 26, 27, 28 and the summing unit 29 will be explained with reference to FIG. 3*a*

According to FIG. 3*a*, the module 20A comprises a number of inputs S1, S2, S3 and S4.

It should be noted that a number of four inputs have been chosen for the purpose of obtaining a relatively simple explanation of the basic principles of the invention. Many other input numbers may be applicable.

Each of the inputs are directed to an early pattern generator 26, 27 and 28. Each early pattern generator generates a processed signal specifically established and chosen for the source input S1, S2, S3 and S4. The processed signals, according to the shown embodiment, are established as a signal composed of seven signal components d1, d2, d3, d4, d5, d6 and d7. The seven signal components represent a directional signal representation of the established sound and the established signal contains both the direct sound and the initial reverberation sound.

A possible embodiment of the invention implies a five channel rendering of 10-directional signal where the directions of the input signal format are 0, +/−15, +/−30, +/−70, +/−110 and 180 degrees, and the intended location of the five corresponding loudspeakers are 0, +/−30 and +/−110 degrees according to ITU 775.

Obviously, several other directions and locations may be applicable. A preferred embodiment comprises more than 20 directions.

Accordingly, each of the inputs S1, S2, S3 and S4 may refer to mutually different locations of the input source to which the early pattern is generated.

Successively, the signals from each source are summed in summing unit 29. The summing is carried out as a simple adding of each signal component, i.e.

$$d1 := d1(S1) + d1(S2) + d1(S3)°d1(S4),$$

$$d2 := d2(S2) + d2(S2) + d2(S3) + d2(S4),$$

$$d3 := d3(S1) + d3(S2) + d3(S3) + d3(S4)$$

$$d4 := d4(S1) + d4(S2) + d4(S3) + d4(S4)$$

$$d5:=d5(S1)+d5(S2)+d5(S3)+d5(S4)$$

$$d6:=d6(S1)+d6(S2)+d6(S3)+d6(S4)$$

and $$d7:=d7(S1)+d7(S2)+d7(S3)+d7(S4)$$

It should be noted that, even though undesired, according to the preferred embodiment of the invention, the signals d1, . . . , d7 may comprise tail sound components or even whole tail-sound. It should nevertheless be emphasised that according to the preferred embodiment of the invention such tail sound may advantageously be generated according to a relatively simple panning algorithm and subsequently added to the established summed initial sound signal as the established summed initial sound comprises the dominating room determining effects.

Moreover, it should be emphasised that a separate tuning of the resulting tail-sound signal is much easier when made separately from the individual tuning of the different source generators.

Turning now to module 20B, FIG. 3*b* illustrates the basic functioning of the direction rendering unit 201.

According to the shown embodiment of the invention, the seven directional signal outputs from the module 20A are mapped into a chosen multi-channel representation. According to the illustrated embodiment, the seven directional signals are mapped to a P=5 channel output.

According to a preferred embodiment of the invention, the type of multi-channel representation is a selectable parameter, both with respect to number of applied channels and to the type of speaker setup and the individual speaker characteristics.

The conversion into a given desired P channel representation may be effected in several different ways such as implying HRTF based (head related transfer function), a technique mentioned as Ambisonics, VBAP (vector based amplitude panning) or a pure experience based subjective mapping.

Turning now to FIG. 3*c* module 20C is illustrated as having an input from each of the source inputs S1, S2, S3 and S4. The signals are fed to a reverb feed matrix 202 having five outputs, corresponding to the chosen channel number of the direction rendering unit 201. The five channel outputs are fed to a reverberation unit 203 providing a five channel output of subsequent reverberation signals.

The reverb feed matrix 202 comprises relatively simple signal pre-processing means (not shown) setting the gain, delay and phase of each input's contribution to each reverb signal and may also comprise filtering pre-processing means.

Subsequently, the reverberation unit 203 establishes the desired diffuse tail sound signal by means of five tank circuits (not shown) and outputs the resulting sound signal to be added to the already established space processed initial sound signal. According to the illustrated preferred embodiment of the invention, the tail sound generating means are added using almost no space processing due to the fact that a space processing of the tail sound signal according to the diffuse nature of the signal has little or no effect at all. Consequently, the complexity of the overall algorithm may be reduced when adding the tail sound separately and making the tuning much easier.

Moreover, it should be noted that the above mentioned separate generation of the tail-sound provides a more natural diffuse tail-sound due to the fact that the distinct comb-filter effect of the early pattern generator should preferably only be applied to the initial pattern in order to provide naturalness.

It should be noted that the above generation of subsequent reverberation signals, according to the present preferred embodiment, is generated independently of the initial sound generation. Nevertheless, it should be emphasised that the invention is in no way restricted to a narrow interpretation of the basic generation of a reverberation sound. Thus, within the scope of the invention, both the initial sound and the sound tail of each sound may of course be located within an artificial room and subsequently summed in a summing unit.

Figure 4A:
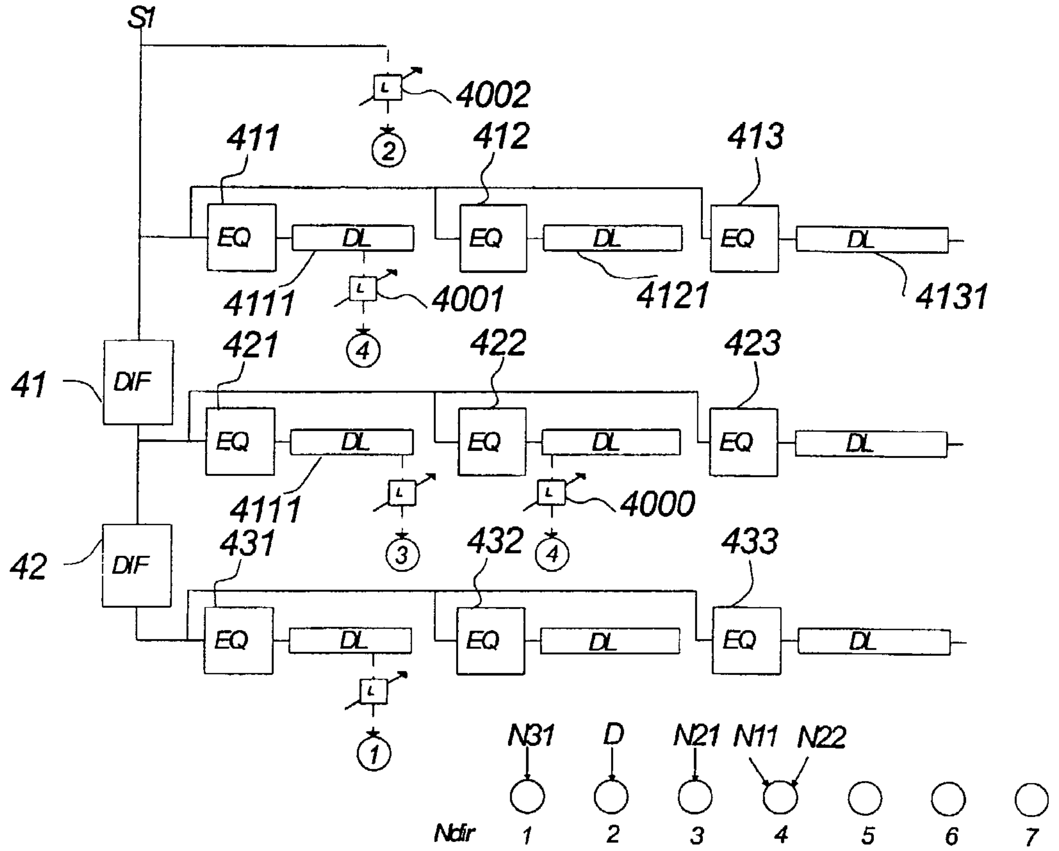

Turning now to FIG. 4*a*, an early pattern generator, such as 26 of FIG. 2, is illustrated in detail. The early pattern generator is one of four according to the above described illustrative embodiment of FIG. 2, and each generator comprises a dedicated source input S1, S2, S3 and S4.

The shown early pattern generator 26 comprises a source input S1.

According to the shown embodiment, the source input is connected to a matrix of signal processing means. The shown matrix basically comprises three rows of signal processing lines, which are processed by shared diffusors 41, 42.

According, the upper row is fed directly from the input S1, the second rod is fed through the diffuser 41, and the third row is fed through both diffusers 41 and 42.

Each row of the signal processing circuit comprises colour filters 411, 412, 413; 421, 422, 423; 431, 432, 433. According to the shown embodiment, colour filters of the same columns are identical, i.e. colour filter 411=421=431.

It should nevertheless be emphasised that the colour filters may of course differ within the scope of the invention.

Moreover each row comprises delay lines 4111, 4121, and 4131 which are serially connected to the colour filters 411, 412, 413. Finally, each column may be tapped via level and phase controllers such as 4000, 4001 and 4002. It should be noted that each level-phase controller 4000, 4001 and 4002 are tap specific.

Hence, the initial pattern generator 26 comprises a matrix which may comprise several sets of predefined presets by which a certain desired room may be emulated.

As already mentioned and according to the simplified embodiment of the invention, signals of the current predefined room emulation are tapped to the directional signal representation of the present sound source S1. According to the illustrated programming, four signal lines are tapped to seven directional signal components. One signal N13 of row 1, column 3, is fed to sound component 1, one signal, N21, is fed to signal component 3, and two signals, N11 and N22 are added to the sound component 4.

It should be noted that each tapped signal has consequently been processed through one of three combinations of diffusers, one of three types of predefined colour filters EQ, a freely chosen length of delay line and a freely chosen level and phase output.

Obviously, several other combinations and number processing elements are applicable within the scope of the invention.

According to one of the preferred embodiment of the invention, a separate row with a level-phase controller 4002 should be tapped and determine the direct sound. When integrating the direct sound into the early pattern generation, the location of both the direct sound as well as the corresponding EPG and reverberation sound signals may be mapped into the sound signal representation completely similar to the desired directionality irrespective of directional resolution and complexity.

Evidently, the directional signal representation components usually comprise signals fed to each component 1-7 and not only the illustrated three.

It should be noted, that the chosen topology of the early pattern generator within the scope of the invention may be chosen from a set of more or less equivalent topologies. Moreover, the signal modifying components may be varied, if e.g. a certain degree of tail-sound is added before or after tapping.

As the illustrated early pattern generator comprises linear systems, it will be possible to interchange the components, e.g. the colour filters EQ may be interchanged with the diffusers DIF.

Figure 4B:
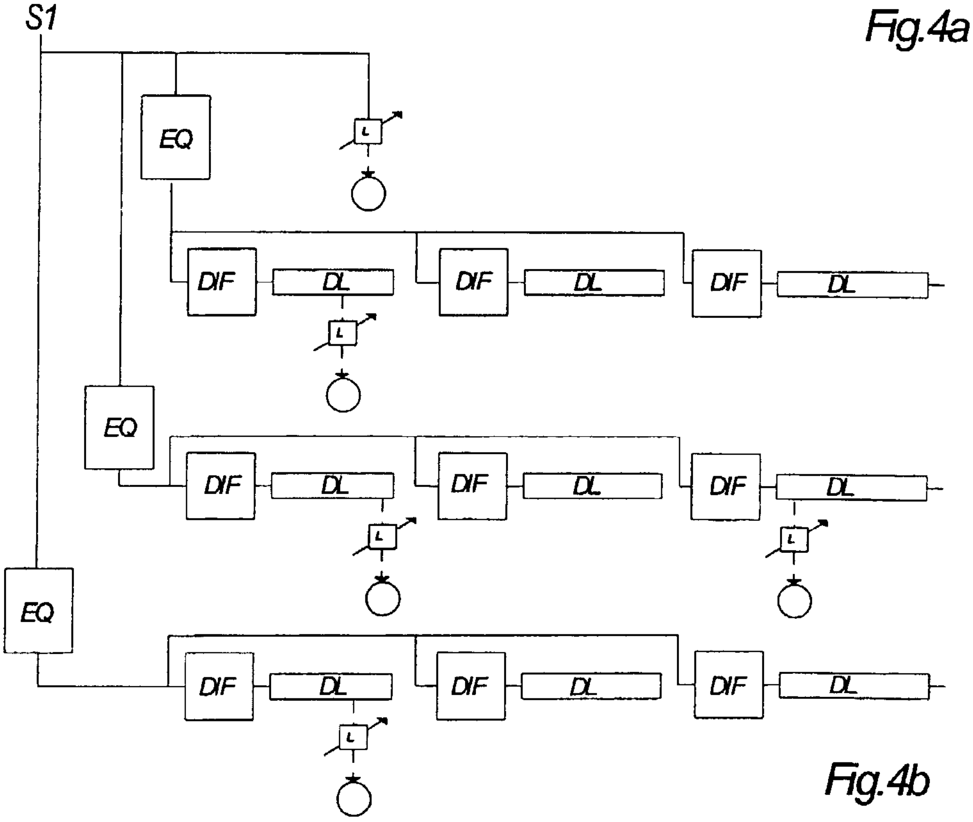

FIG. 4*b* illustrates a further possible embodiment of the early pattern generator, comprising colour filters EQ placed in the feed line to each row and diffusers DIF placed in each column in each row.

Likewise, the numbers of columns and rows may vary depending of the system requirements. In a possible embodiment only one column of delay lines with corresponding colour filters or diffusers is utilised. Moreover, additional components, additional diffusers, additional different types of colour filters, etc. may be chosen.

Finally, it should be mentioned that, according to a preferred embodiment of the invention, the number of directions, i.e. signal components, should not be less than twelve, and the established reflections of each early pattern generator should not be less than 25.

The basic presetting of each early pattern generator may initially be determined by known commercially available ray tracing or room mirroring tool, such as ODEON.

The invention claimed is:

1. A signal processing unit comprising:

at least two inputs; and at least two early pattern generators for defining a predefined early pattern generation, each of said at least two early pattern generators being connected to at least one of said at least two inputs;

each of said at least two early pattern generators establishing an output having N directional components, each of said N directional components of said outputs being added to form at least one signal having N directional components;

the signal processing unit further comprising:

a direction rendering unit with an input for at least one of said at least signal having N directional components, said direction rendering unit establishing P channel output signals on an output of the direction rendering unit corresponding to input signals having N directional components;

a circuit having S inputs and P outputs, S being at least two and said S inputs being connected to said at least two inputs, said P outputs comprising a P-channel late reverberation signal; and a summing unit for adding said late reverberation signal to said established P-channel output signals of said direction rendering unit.

2. The signal processing unit according to claim 1, wherein said P channel output signals are established in such a way that said P channel output signals correspond to a P-channel trans- or bin-aural representation of said at least one signal having N directional components.

3. The signal processing unit according to claim 1, wherein said P channel output signals are established in such a way that said P channel output signals correspond to an experience-based P-channel representation of said at least one signal having N directional components.

4. A method of establishing a room response on the basis of an input signal feed through a signal processing unit comprising:

at least two inputs; and at least two early pattern generators for defining a predefined early pattern generation, each of said at least two early pattern generators being connected to at least one of said at least two inputs, each of said at least two early pattern generators establishing an output having N directional components, each of said N directional components of said outputs being added to form at least one signal having N directional components;

the signal processing unit further comprising:

a direction rendering unit with an input for at least one of said at least signal having N directional components, said direction rendering unit establishing P channel output signals on an output of the direction rendering unit corresponding to input signals having N directional components;

a circuit having S inputs and P outputs, S being at least two and said S inputs being connected to said at least two inputs, said P outputs comprising a P-channel late reverberation signal; and a summing unit for adding said late reverberation signal to said established P-channel output signals of said direction rendering unit.

* * * * *